US012721257B2

(12) United States Patent
Ishihira

(10) Patent No.: US 12,721,257 B2
(45) Date of Patent: Sep. 1, 2026

(54) WORK ROBOT

(71) Applicant: YAMABIKO CORPORATION, Ohme (JP)

(72) Inventor: Daisuke Ishihira, Ohme (JP)

(73) Assignee: Yamabiko Corporation, Tokyo (JP)

( * ) Notice: Subject to any disclaimer, the term of this patent is extended or adjusted under 35 U.S.C. 154(b) by 960 days.

(21) Appl. No.: 17/697,166

(22) Filed: Mar. 17, 2022

(65) Prior Publication Data

US 2022/0295698 A1 Sep. 22, 2022

(30) Foreign Application Priority Data

Mar. 17, 2021 (JP) ................................ 2021-043235

(51) Int. Cl.
*A01D 34/00* (2006.01)
*A01D 101/00* (2006.01)
(Continued)

(52) U.S. Cl.
CPC ......... *A01D 34/008* (2013.01); *G01R 33/072* (2013.01); *G05D 1/0212* (2013.01);
(Continued)

(58) Field of Classification Search
CPC ............ A01D 34/008; A01D 2101/00; G05D 1/0212; G05D 1/0238; G05D 1/0259;
(Continued)

(56) References Cited

U.S. PATENT DOCUMENTS

2005/0171639 A1* 8/2005 Uehigashi ............ G05D 1/0227 701/23
2013/0098402 A1 4/2013 Yoon et al.
(Continued)

FOREIGN PATENT DOCUMENTS

JP 2011060085 A 3/2011
JP 2013089256 A 5/2013
(Continued)

OTHER PUBLICATIONS

JP2018014963 Ito Machine Translation (Year: 2018).*
(Continued)

*Primary Examiner* — Kito R Robinson
*Assistant Examiner* — Zachary E. F. Glade
(74) *Attorney, Agent, or Firm* — BakerHostetler

(57) ABSTRACT

A work robot, capable of suppressing a decrease in work efficiency in an area where an obstacle exists, includes a traveling device, first and second collision sensors and a control device. The control device is configured to determine based the first and second collision sensors, whether or not the work robot has collided with an obstacle, and further determine whether the work robot has collided with the obstacle on a left side or on a right side with respect to the center of the work robot, so as to control the traveling device. The control device is operable, when it determines that the work robot has collided with the obstacle, to control the traveling device to change the orientation of the work robot toward a side opposite to the collision side, and then move the work robot forwardly.

6 Claims, 5 Drawing Sheets

(51) Int. Cl.
*G01R 33/07* (2006.01)
*G05D 1/00* (2024.01)

(52) U.S. Cl.
CPC ......... *G05D 1/0238* (2013.01); *G05D 1/0259* (2013.01); *A01D 2101/00* (2013.01)

(58) Field of Classification Search
CPC .... G05D 1/0227; G05D 1/2287; G05D 1/241; G05D 1/245; G01R 33/072
See application file for complete search history.

(56) References Cited

U.S. PATENT DOCUMENTS

| | | | | |
|---|---|---|---|---|
| 2016/0334791 | A1* | 11/2016 | Schnittman | G05D 1/024 |
| 2017/0273531 | A1 | 9/2017 | Watanabe et al. | |
| 2018/0235421 | A1 | 8/2018 | Tsuboi et al. | |
| 2020/0081447 | A1* | 3/2020 | Bautista | G01L 1/12 |
| 2020/0178750 | A1* | 6/2020 | Lin | G05D 1/0238 |
| 2021/0145236 | A1* | 5/2021 | Ohm | A47L 9/2805 |

FOREIGN PATENT DOCUMENTS

| | | | | | |
|---|---|---|---|---|---|
| JP | 2017091263 | A | | 5/2017 | |
| JP | 2018-14963 | A | | 2/2018 | |
| JP | 2018014963 | A | * | 2/2018 | G05D 1/0227 |

OTHER PUBLICATIONS

European Search Report issued in European Patent Application No. 22162528.8 mailed Dec. 22, 2022.
Partial Supplementary European Search Report issued in European Patent Application No. 22162528.8 mailed Aug. 3, 2022.

* cited by examiner

WORK ROBOT

CROSS REFERENCE TO RELATED APPLICATION

This application claims benefit of priority to Japanese Patent Application No. 2021-043235, filed on Mar. 17, 2021, the entire content of which is incorporated herein by reference.

BACKGROUND OF THE INVENTION

Technical Field

The present invention relates to a work robot designed to perform a given work while traveling autonomously over a given area.

Background Art

There is known a work robot designed to perform a work while traveling autonomously. For example, a robotic lawn mower becomes popular which is designed to perform a lawn-mowing work while traveling over a given area based on a program. Further, there are also known a robotic cleaner designed to vacuum and remove dust and debris on a floor while traveling on the floor, a ball picker designed to collect a large number of golf balls scattered on the ground of a driving range, etc.

Such a work robot is required to, when it collides with an obstacle (e.g., tree, fence, wall or furniture) in an area, detour around the obstacle, and continue traveling and working. In response to this requirement, the below-mentioned Patent Document 1 proposes a self-traveling work machine equipped with a contact detection mechanism. This work machine is configured such that, when the contact detection mechanism detects a contact with an obstacle, a traveling direction thereof is changed to detour around the obstacle.

CITATION LIST

Patent Document

Patent Document: JP 2018-014963A

SUMMARY OF INVENTION

Technical Problem

However, as a result of changing the traveling direction so as to detour around the obstacle, the work machine described in the Patent Document 1 is likely to travel again on a part of the area where an intended work has already been completed. Such traveling which does not contribute to the progress of the work causes a situation where it takes a long time to complete the work for the entire area. Thus, in this regard, there remains a need for the conventional work robot to be improved.

The present invention has been made to solve the above problem, and an object thereof is to provide a work robot capable of suppressing a decrease in work efficiency in an area where an obstacle exists.

Solution to Technical Problem

In order to achieve the above object, the present invention provides a work robot designed to perform a given work while traveling autonomously over a given area. The work robot comprises: a traveling device configured to switch between forward and backward movements of the work robot, and change an orientation of the work robot; a collision sensor configured to output a signal regarding a collision between the work robot and an obstacle; and a control device configured to determine, based on the signal received from the collision sensor, whether or not the work robot has collided with an obstacle, and further determine a collision side indicative of whether the work robot has collided with the obstacle on a left side with respect to a center of the work robot, or has collided with the obstacle on a right side with respect to the center of the work robot, so as to control the traveling device, wherein the control device is operable, when it determines that the work robot has collided with the obstacle, to control the traveling device to change the orientation of the work robot toward a side opposite to the collision side, and then move the work robot forwardly.

In the event of collision with an obstacle, the work robot configured as above is moved forwardly after changing the orientation thereof toward a side opposite to the collision side. Here, the "collision side" is indicative of which of the left side and the right side of the work robot with respect to the center thereof as viewed in a direction of the forward movement of the work robot has collided with an obstacle. That is, when the left side of the work robot with respect to the center thereof collides with the obstacle, the orientation of the work robot is changed toward the right side. On the other hand, when the right side of the work robot with respect to the center thereof collides with the obstacle, the orientation of the work robot is changed toward the left side. This makes it possible to set a detour course so as to allow the work robot to reliably detour around the obstacle while becoming less likely to enter a part of a given area where the work has already been completed, thereby suppressing a decrease in work efficiency.

In the following description, for the sake of facilitating understanding, the traveling direction of the work robot at the time of collision with an obstacle will be referred to as "in-collision traveling direction", and one side with respect to the obstacle in the in-collision traveling direction and the other side with respect to the obstacle in a direction opposite to the in-collision traveling direction will be referred to occasionally as "forward side" and "backward side", respectively.

Preferably, in the work robot of the present invention, the control device is operable to control the traveling device to change the orientation of the work robot toward the side opposite to the collision side at an angle of less than 90 degrees with respect to a traveling direction of the work robot at a time of the collision between the work robot and the obstacle.

In the work robot configured as above, in the event of collision with an obstacle, the orientation thereof is changed at an angle of less than 90 degrees with respect to the in-collision traveling direction. Thus, after the collision with the obstacle, the work robot moves from the backward side on which it is located until then to the forward side, so that it becomes less likely to enter a part of the given area where the work has already been completed. As a result, it becomes possible to quickly complete the work for the entire given area.

More preferably, in the above work robot, the control device is operable, when it determines that the work robot has collided with the obstacle during the forward movement, to control the traveling device to move the work robot backwardly by a given distance, and then change the orientation of the work robot toward the side opposite to the collision side at an angle of less than 90 degrees with respect to the traveling direction of the work robot at the time of the collision between the work robot and the obstacle.

In the event of collision with an obstacle, the work robot configured as above is moved backwardly by a given distance, so that it can be separated from the obstacle which is blocking a traveling course of the work robot. This makes it possible to detour around the obstacle even when the orientation is changed at a relatively small angle, and thus suppress a situation where a detour course needlessly gets longer.

Even more preferably, in the above work robot, the control device is operable, when it determines that the work robot has collided with the obstacle during the forward movement, to control the traveling device to: move the work robot backwardly by a given distance; then change the orientation of the work robot toward the side opposite to the collision side at an angle of less than 90 degrees with respect to the traveling direction of the work robot at the time of the collision between the work robot and the obstacle; then move the work robot forwardly in a first direction; and then change the orientation of the work robot so as to return to a course extending in the traveling direction of the work robot at the time of the collision between the work robot and the obstacle.

The work robot configured as above can return to the course extending in the in collision traveling direction while detouring around the obstacle, so that it becomes possible to suppress the situation where the detour course needlessly gets longer.

Preferably, in the work robot of the present invention, the collision sensor comprises a magnet, and a hall sensor having a detection part to detect an intensity of a magnetic field generated by the magnet, the hall sensor being configured to output a signal corresponding to the intensity of the magnetic field, wherein, in a direction parallel to a straight line passing through an N pole and an S pole of the magnet, the detection part of the hall sensor is disposed at a position between an N pole-side end and an S pole-side end of the magnet, and wherein the position of the detection part of the hall sensor with respect to the magnet is changeable in the direction parallel to the straight line, based on the collision between the work robot and the obstacle.

When the work robot configured as above collides with an obstacle, the position of the detection part of the hall sensor with respect to the magnet is changed. Since the detection part is disposed at the position between the N pole-side end and the S pole-side end, the intensity of the magnetic field detected by the detection part shows opposite changes (decreasing and rising), respectively, when the detection part is relatively displaced from the position toward the N pole side and when the detection part is relatively displaced from the position toward the S pole side. Thus, the control device can determine that the work robot has collided with an obstacle, based on such a change in the signal.

More preferably, in the above work robot, the collision sensor is provided by a number of two, wherein the magnet of a first collision sensor which is one of the two collision sensors is disposed such that the straight line passing through the N pole end and the S pole thereof passes through the center of the work robot and becomes approximately parallel to a center line extending along a forward/backward direction of the work robot, and the magnet of a second collision sensor which is a remaining one of the two collision sensors is disposed such that the straight line passing through the N pole end and the S pole thereof becomes approximately orthogonal to the center line.

When the work robot configured as above collides with an obstacle in the forward/backward direction, the signal output by the first collision sensor changes, and when it collides with an obstacle in a rightward/leftward direction, the signal output by the second collision sensor changes. Thus, based on such signals, the control device can determine whether or not the work robot has collided with the obstacle in the forward/backward direction and in the rightward/leftward direction.

Even more preferably, in the above work robot, the magnet and the hall sensor of the second collision sensor are disposed on the center line.

Even in a situation where a distortion arises in the structure of the work robot in a roll direction (i.e., direction about the central line), the amount of the distortion is smaller in a part of the work robot on the central line than in a remaining part of the work robot. By disposing the second collision sensor on the center line, the work robot can suppress a bad influence of the distortion of the structure of the work robot on the second collision sensor, thereby improving accuracy in determination of collision between the work robot and an obstacle.

Even more preferably, the above work robot comprises a robot main unit provided with the traveling device and the control device, and a cover which covers the robot main unit, wherein the magnet is provided in the cover, and the hall sensor is provided in the robot main unit.

In the work robot configured as above, there is no need to provide a feed line and a signal line extending from the robot main unit provided with the hall sensor, to the magnet provided in the cover. This makes it possible to simplify a structure around the collision sensor, and improve reliability thereof.

Effect of Invention

The present invention can provide a work robot capable of suppressing a decrease in work efficiency in an area where an obstacle exists.

DESCRIPTION OF EMBODIMENTS

Figure 1A:
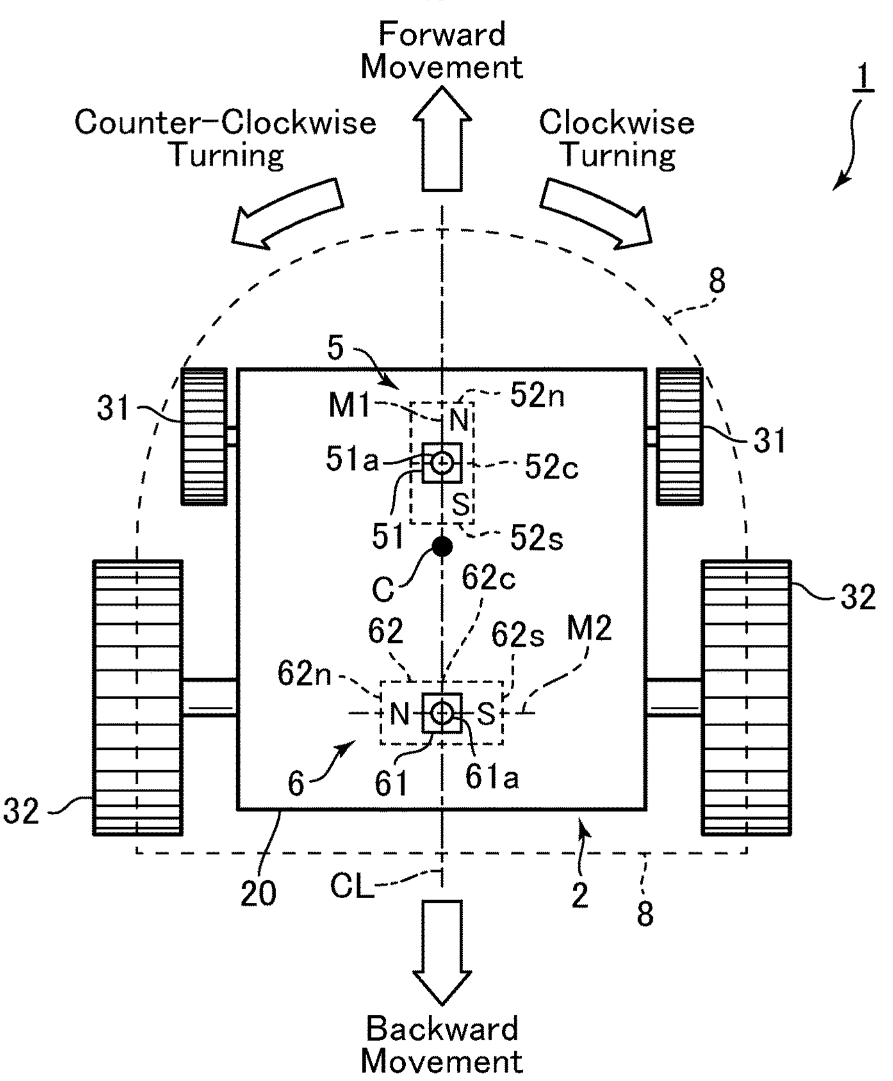
FIG. 1A is a schematic diagram showing a work robot according to one embodiment of the present invention.
Figure 1B:
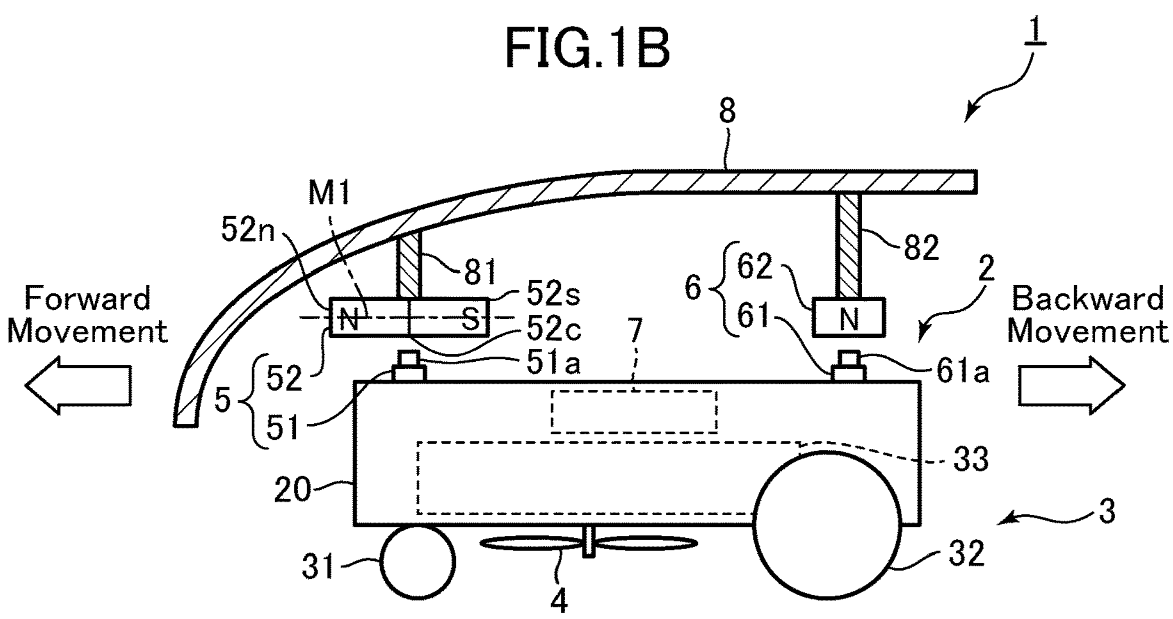
FIG. 1B is a schematic diagram showing a work robot according to one embodiment of the present invention.

With reference to FIG. 1, a work robot 1 according to one embodiment of the present invention (hereinafter referred to as "robot 1") will be described. FIG. 1 is a schematic diagram showing the robot 1. FIG. 1A is a top plan view of the robot 1, wherein the after-mentioned cover 8 is indicated by a broken line. FIG. 1B is a side view of the robot 1, wherein the cover 8 is shown as a cross-section taken along a plane passing through the after-mentioned center line CL.

<Configuration of Robot>

The robot 1 is a lawn mower for mowing a lawn growing in a given area. The robot 1 comprises a robot main unit 2 and a cover 8.

The robot main unit 2 comprises a casing 20, a traveling device 3, a cutter 4, a first hall sensor 51, a second hall sensor 61, and a control device 7.

The traveling device 3 comprises a pair of front wheels 31 and a pair of rear wheels 32 each arranged outside the casing 20, and a driving unit 33 housed inside the casing 20. The driving unit 33 is comprised of a motor, a gearbox and others, and configured to be driven by electric power supplied from a non-illustrated battery. The driving unit 33 is operable to rotationally drive the pair of rear wheels 32 in the same direction, thereby moving the robot 1 forwardly or backwardly. Further, the driving unit 33 is operable to stop the rotation of one of the rear wheels and rotationally drive the other rear wheel, or to rotationally drive the pair of rear wheels at different rotational speeds, respectively, or to rotationally drive the pair of rear wheels in different directions, respectively, thereby turning the robot 1 in a clockwise or counter-clockwise direction to change a traveling direction of the robot 1.

In the following description, a direction along which the robot 1 moves forwardly will be referred to as "forward direction", and a direction along which the robot 1 moves backwardly will be referred to as "backward direction". Further, the left side in a state in which the robot 1 faces forwardly will be referred to as "left", and the right side in the state in which the robot 1 faces forwardly will be referred to as "right".

The cutter 4 is disposed at the bottom of the main unit 2 in opposed relation to a lawn. When the non-illustrated motor is driven by electric power supplied from the non-illustrated battery, the cutter 4 is rotated to cut the lawn beneath the cutter 4 into a given length. The length of the lawn after cutting can be adjusted by adjusting the position of the cutter 4 in a vertical direction.

Each of the first hall sensor 51 and the second hall sensor 61 is an analog output type magnetic sensor configured to detect the intensity of magnetic field and after converting the detected intensity to an analog signal, output the analog signal. The first hall sensor 51 is a part of the configuration of a first collision sensor 5, and the second hall sensor 61 is a part of the configuration of a second collision sensor 6. Each of the first hall sensor 51 and the second hall sensor 61 comprises a corresponding one of a detection part 51*a* and a detection part 61*a*, and is configured to generate a signal corresponding to the intensity of magnetic field in the corresponding one of the detection parts 51*a*, 61*a*, and output the signal to outside. As shown in FIG. 1A, the detection parts 51*a*, 61*a* are arranged on a center line CL passing through the center C in plan view and extending in a forward/backward direction of the robot 1. The detection part 51*a* is disposed forward of the center C, and the detection part 61*a* is disposed backward of the center C. Each of the first hall sensor 51 and the second hall sensor 61 is disposed on an upper part of the casing 20 such that a corresponding one of the detection parts 51*a*, 61*a* is oriented upwardly.

The control device 7 is an electronic device configured to control the traveling device 3 and the cutter 4, and comprises a non-illustrated computing part and storage part. The computing part is configured to carry out computation according to a program preliminarily stored in the storage part, to generate a control signal. The control device 7 is configured to transmit this control signal to the driving unit 33 of the traveling device 3, thereby controlling switching among forward movement, backward movement and stopping of the robot 1, change in the orientation of the robot 1, and on-off switching of the cutter 4. Further, the control device 7 is configured to receive signals output from respective ones of the first hall sensor 51 and the second hall sensor 61, and carry out the after-mentioned determination based on the received signals.

The cover 8 is an exterior member of the robot 1, and is formed of a shock-resistant resin material or the like. As shown in FIG. 1B, the cover 8 is disposed to cover the robot main unit 2 from thereabove, and coupled to the robot main unit 2 by a non-illustrated coupling member. The coupling member is formed of an elastic material such as rubber. Thus, when an external force acts on the cover 8, the coupling member is elastically deformed according to the direction and magnitude of the external force, to allow the cover 8 to be displaced with respect to the robot main unit 2 by the amount of the deformation. For example, the cover 8 is coupled to the robot main unit 2 such that it is displaceable by about 20 mm in each of the forward, backward, leftward, and rightward directions.

As shown in FIG. 1B, the bottom of the cover 8 is provided with a magnet-fixing part 81 at a position close to a front end of the cover 8, and a magnet-fixing part 82 at a position close to a rear end of the cover 8. The magnet-fixing parts 81, 82 protrude downwardly to allow a first magnet 52 and a second magnet 62 to be fixed to respective lower ends thereof. The first magnet 52 is a part of the configuration of the first collision sensor 5, and the second magnet 62 is a part of the configuration of the second collision sensor 6.

The first magnet 52 is fixed such that a straight line M1 passing through the N pole and the S pole thereof is approximately coincident with the center line CL in plan view, and extends approximately horizontally. On the other hand, the second magnet 62 is fixed such that a straight line M2 passing through the N pole and the S pole thereof is approximately orthogonal to the center line CL in plan view, and extends approximately horizontally.

Further, in a state in which the cover 8 is coupled to the robot main unit 2, the first magnet 52 is disposed in the vicinity of the detection part 51*a* of the first hall sensor 51, and the second magnet 62 is disposed in the vicinity of the detection part 61*a* of the second hall sensor 61. More specifically, when no external force acts on the cover 8, the detection part 51*a* of the first hall sensor 51 is disposed at a position opposed to a middle 52*c* between an N pole-side end 52*n* and an S pole-side end 52*s* of the first magnet 52 in a direction parallel to the straight line M1 of the first magnet 52. On the other hand, the detection part 61*a* of the second hall sensor 61 is disposed at a position opposed to a middle 62*c* between an N pole-side end 62*n* and an S pole-side end 62*s* of the second magnet 62 in a direction parallel to the straight line M2 of the second magnet 62. That is, the first hall sensor 51 is configured to output a signal corresponding to the intensity of a magnetic field mainly generated by the first magnet 52, in the position of the detection part 51*a*, and the second hall sensor 61 is configured to output a signal corresponding to the intensity of a magnetic field mainly generated by the second magnet 62, in the position of the detection part 61*a*.

The cover 8 is displaceable with respect to the robot main unit 2 by the deformation amount of the coupling member, as mentioned above, and, when the cover 8 is displaced, the first magnet 52 and the second magnet 62 are also displaced.

As a result, a change arises in each of a positional relationship between the first magnet 52 and the detection part 51*a* of the first hall sensor 51 and a positional relationship between the second magnet 62 and the detection part 61*a* of the second hall sensor 61. In other words, the positions of the detection parts 51*a*, 61*a* with respect to respective ones of the first and second magnets 52, 62 are changed.

Figure 2:
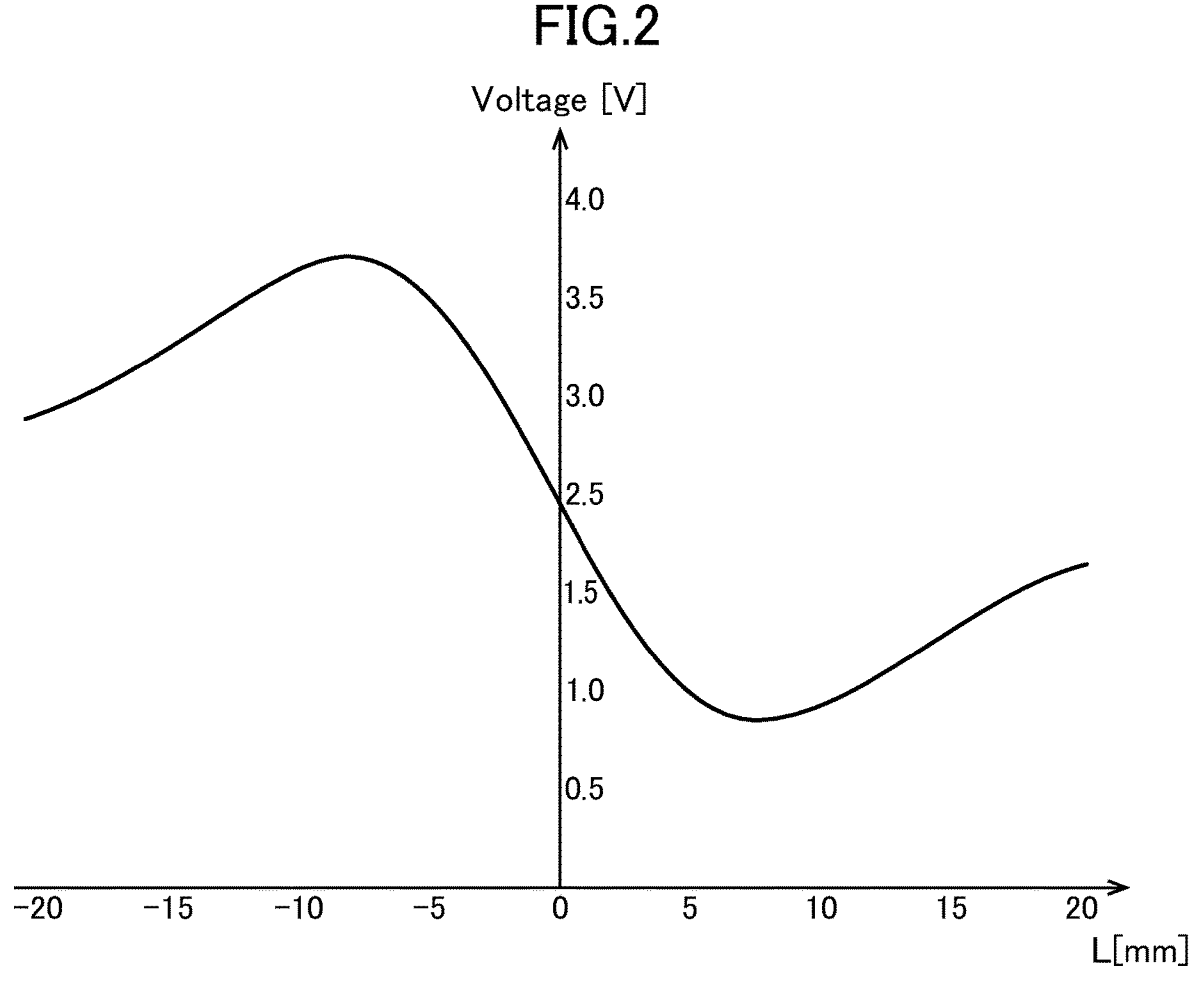
FIG. 2 is a graph showing the characteristic of each signal output from a first hall sensor and a second hall sensor.

FIG. 2 is a graph showing the characteristic of each signal output from the first hall sensor 51 and the second hall sensor 61, based on the positions of the detection parts 51*a*, 61*a* with respect to respective ones of the first and second magnets 52, 62. The horizontal axis of this graph represents a distance L from the middle 52*c* to the detection part 51*a* in a direction along the straight line M1 (or from the middle 62*c* to the detection part 61*a* in a direction along the straight line M2). In this graph, a position opposed to the middle 52*c* (or the middle 62*c*) is defined as an origin (0), and a distance from the origin to each N pole-side position and a distance from the origin to each S pole-side position are expressed as a positive value and a negative value, respectively.

The voltage of the signal output from the first hall sensor 51 continuously varies according to the distance L, as shown in FIG. 2. First, the first hall sensor 51 is set such that the voltage of the signal output therefrom when the detection part 51*a* thereof is located at a position opposed to the middle 52*c* of the first magnet 52 (i.e., when the distance L=0) is 2.5 [V]. Then, when the cover 8 is displaced with respect to the robot main unit 2, and accordingly the detection part 51*a* of the first hall sensor 51 is relatively displaced toward the N pole side of the first magnet 52 (i.e., when the distance L has a positive value), the voltage of the signal output from the first hall sensor 51 decreases. On the other hand, when the detection part 51*a* of the first hall sensor 51 is relatively displaced toward the S pole side of the first magnet 52 (i.e., when the distance L has a negative value), the voltage of the signal output from the first hall sensor 51 rises. This tendency of voltage change can also be applied to the signal output from the second hall sensor 61. Thus, its description will be omitted here.

<Determinations by Control Device>

Next, with reference to FIG. 3, determinations to be performed by the control device 7 will be described. FIG. 3 is an explanatory diagram showing collusion between the robot 1 and the obstacle 9 in plan view, wherein FIG. 3A shows collusion between the robot 1 during forward movement and the obstacle 9, and FIG. 3B shows collusion between the robot 1 during backward movement and the obstacle 9.

The control device 7 is configured to perform “collision determination” and “collision-side determination”. The “collision determination” is performed to determine whether or not the robot 1 has collided with an obstacle such as a tree or a fence. The “collision-side determination” is performed to determine whether the left side or the right side of the robot 1 with respect to the center C has collided with the obstacle. In other words, the “collision-side determination” is performed to determine whether collision between the robot 1 and an obstacle is “left-side collision” in which the left side of the robot 1 with respect to the center C has collided with the obstacle, or “right-side collision” in which the right side of the robot 1 with respect to the center C has collided with the obstacle. The “collision-side determination” is performed to further determine whether collision between the robot 1 and an obstacle is “front-side collision” in which the front side of the robot 1 with respect to the center C has collided with the obstacle, or “rear-side collision” in which the rear side of the robot 1 with respect to the center C has collided with the obstacle.

Figure 3A:
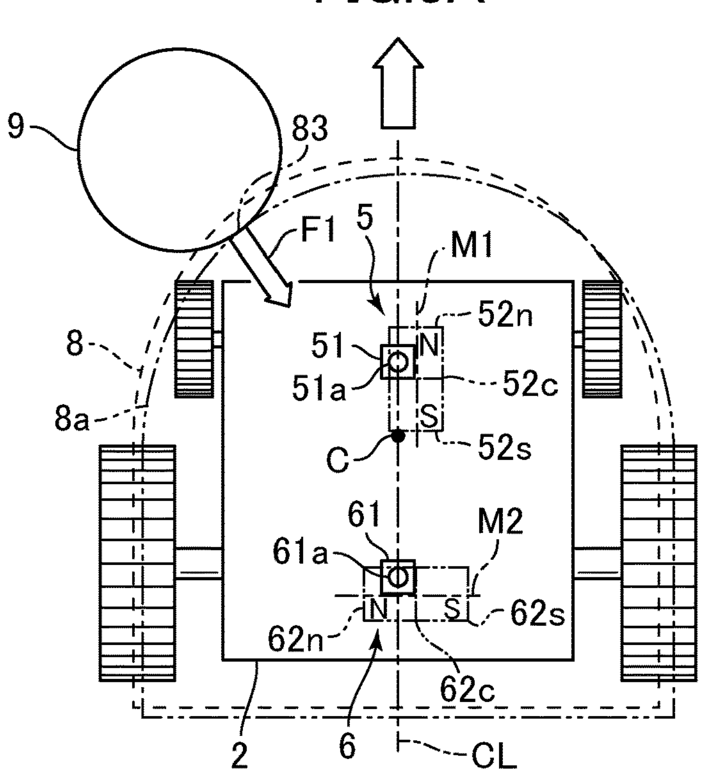
FIG. 3A is an explanatory diagram showing collusion between the work robot and an obstacle in plan view.
Figure 3B:
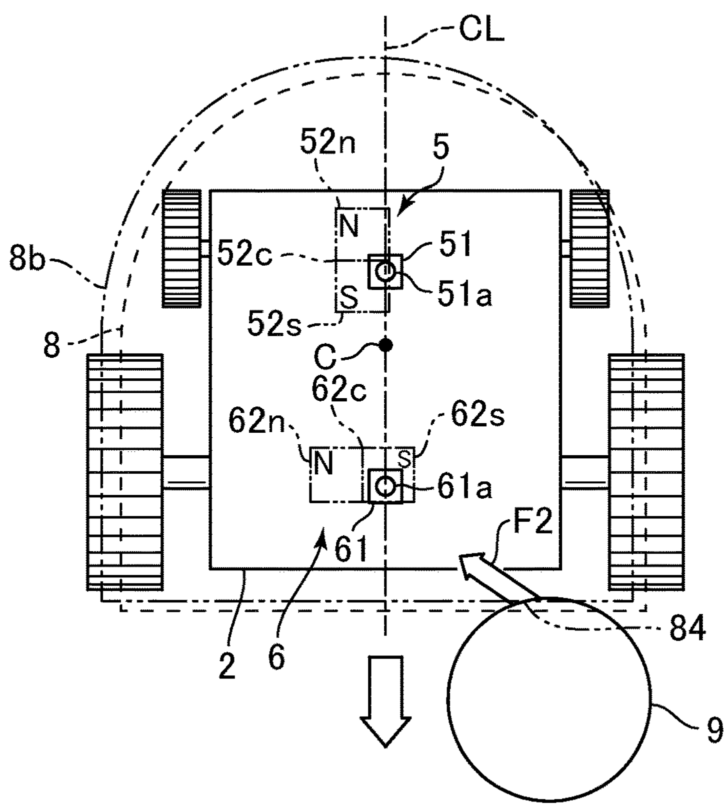
FIG. 3B is an explanatory diagram showing collusion between the work robot and an obstacle in plan view.

FIG. 3A shows a state in which during forward movement, the robot 1 collides with the obstacle 9 at a position of a front left part 83 of the robot 1. The front left part 83 is a part of the front side of the cover 8 with respect to the center C, and located on the left side with respect to the center line CL. Due to this collision, an external force F1 is applied from the obstacle 9 to the front left part 83 in a backward and rightward direction. The two-dot chain line 8*a* denotes the cover 8 which is displaced with respect to the robot main unit 2 in the backward and rightward direction under the external force F1 applied thereto.

Along with the displacement of the cover 8, the first magnet 52 and the second magnet 62 fixed to the magnet-fixing parts 81, 82 of the cover 8 are also displaced with respect to the robot main unit 2 in the backward and rightward direction. As a result, a change arises in each of the positional relationship between the first magnet 52 and the detection part 51*a* of the first hall sensor 51 and the positional relationship between the second magnet 62 and the detection part 61*a* of the second hall sensor 61.

Specifically, the detection part 51*a* which is opposed to the middle 52*c* of the first magnet 52 before the collision will be located on the N pole side with respect to the middle 52*c* after the collision. Further, the detection part 61*a* which is opposed to the middle 62*c* of the second magnet 62 before the collision will be located on the N pole side with respect to the middle 62*c* after the collision. In other words, after the collision, the detection part 51*a* is relatively displaced toward the N pole side with respect to the middle 52*c*, and the detection part 61*a* is relatively displaced toward the N pole side with respect to the middle 62*c*. As a result, the voltage of the signal output from each of the first hall sensor 51 and the second hall sensor 61 decreases as compared with that before the collision.

When the voltage of the signal output from the first hall sensor 51 becomes less than a predetermined threshold, the control device 7 determines that the front side of the robot 1 with respect to the center C has collided with the obstacle (determination of the front-side collision). Further, when the voltage of the signal output from the second hall sensor 61 becomes less than a predetermined threshold, the control device 7 determines that the left side of the robot 1 with respect to the center C has collided with the obstacle (determination of the left-side collision).

FIG. 3B shows a state in which during backward movement, the robot 1 collides with the obstacle 9 at a position of a rear right part 84 of the robot 1. The rear right part 84 is a part of the rear side of the cover 8 with respect to the center C, and located on the right side with respect to the center line CL. Due to this collision, an external force F2 is applied from the obstacle 9 to the rear right part 84 in a forward and leftward direction. The two-dot chain line 8*b* denotes the cover 8 which is displaced with respect to the robot main unit 2 in the forward and leftward direction under the external force F3 applied thereto.

Along with the displacement of the cover 8, the first magnet 52 and the second magnet 62 fixed to the magnet-fixing parts 81, 82 of the cover 8 are also displaced with respect to the robot main unit 2 in the forward and leftward direction. As a result, a change arises in each of the positional relationship between the first magnet 52 and the detection part 51*a* of the first hall sensor 51 and the positional relationship between the second magnet 62 and the detection part 61*a* of the second hall sensor 61.

Specifically, the detection part 51*a* which is opposed to the middle 52*c* of the first magnet 52 before the collision will be located on the S pole side with respect to the middle 52*c* after the collision. Further, the detection part 61*a* which is opposed to the middle 62*c* of the second magnet 62 before the collision will be located on the S pole side with respect to the middle 62*c* after the collision. In other words, after the collision, the detection part 51*a* is relatively displaced toward the S pole side with respect to the middle 52*c*, and the detection part 61*a* is relatively displaced toward the S pole side with respect to the middle 62*c*. As a result, the voltage of the signal output from each of the first hall sensor 51 and the second hall sensor 61 rises as compared with that before the collision.

When the voltage of the signal output from the first hall sensor 51 becomes greater than a predetermined threshold, the control device 7 determines that the rear side of the robot 1 with respect to the center C has collided with the obstacle (determination of the rear-side collision). Further, when the voltage of the signal output from the second hall sensor 61 becomes greater than a predetermined threshold, the control device 7 determines that the right side of the robot 1 with respect to the center C has collided with the obstacle (determination of the right-side collision).

<First Mode of Detour Course>

Figure 4:
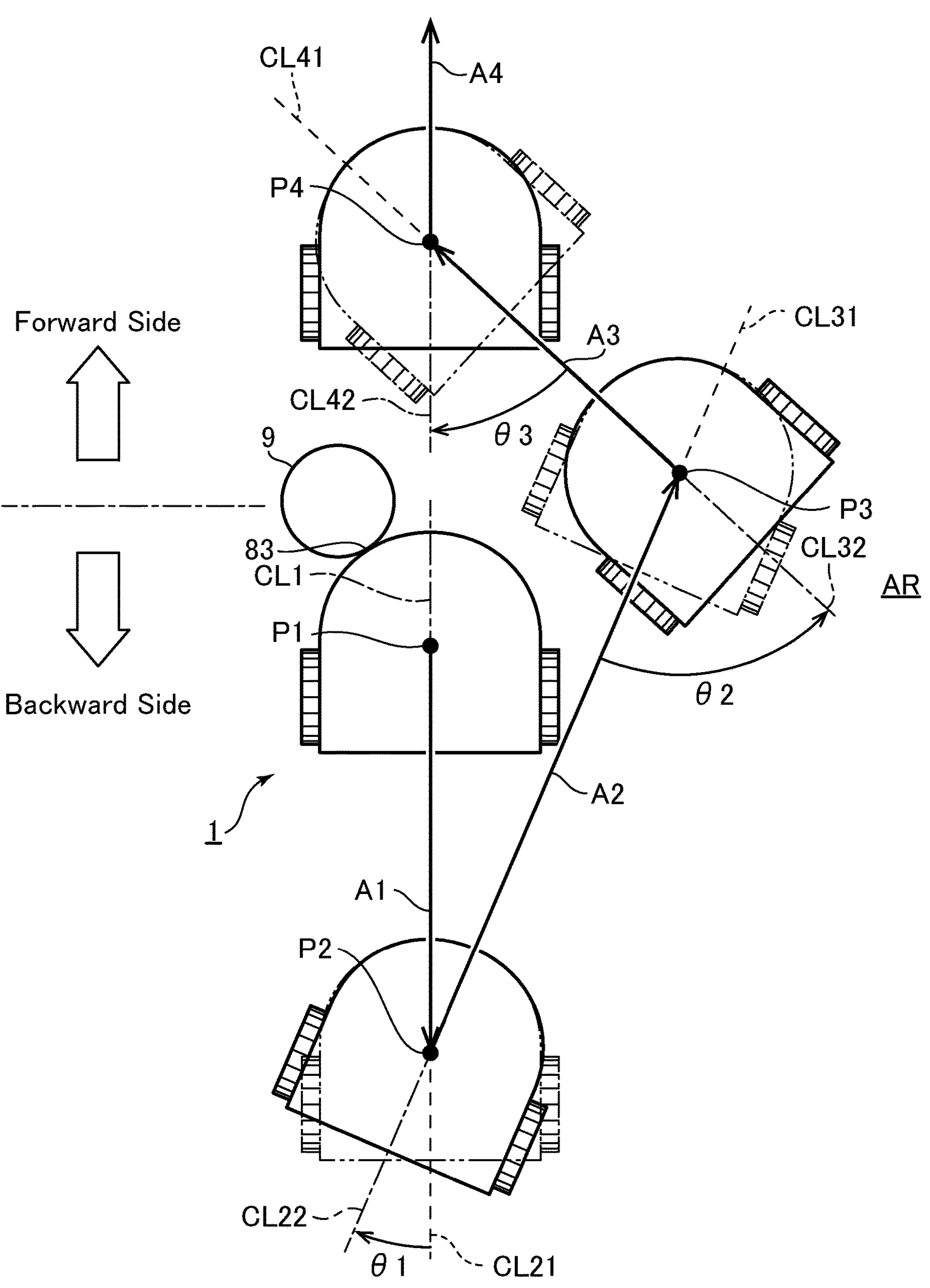
FIG. 4 is an explanatory diagram showing a first mode of a detour course of the work robot in plan view.

Next, with reference to FIG. 4, one mode of a detour course of the robot 1 which has collided with the obstacle 9 will be described. FIG. 4 is an explanatory diagram showing a first mode of a detour course of the robot in plan view, in a situation where when the robot being moved forwardly while mowing a lawn in an area AR reaches a point P1, the front left part 83 of the robot 1 collides with the obstacle 9.

In the following description, the traveling direction of the robot 1 at the time of collision with the obstacle 9 will be referred to as "in-collision traveling direction". Further, one side with respect to the obstacle 9 in the in-collision traveling direction and the other side with respect to the obstacle 9 in a direction opposite to the in-collision traveling direction will be referred to as "forward side" and "backward side", respectively.

When the front left part 83 of the robot 1 collides with the obstacle 9, an external force is applied from the obstacle 9 to the front left part 83 in the backward and rightward direction, and the cover 8, the first magnet 52 and the second magnet 62 are displaced with respect to the robot main unit 2 in the backward and rightward direction. As a result, the voltage of the signal output from each of the first hall sensor 51 and the second hall sensor 61 decreases as compared with that before the collision. Based on the change in the voltage, the control device 7 determines that the front side and the left side of the robot 1 with respect to the center C has collided with the obstacle, Next, the control device 7 controls the traveling device 3 to move the robot 1 from the point P1 to a point P2. Specifically, the control device 7 controls the traveling device 3 to move the robot 1 backwardly by a given distance along a center line CL1 of the robot 1 at the time of collision with the obstacle 9, as indicated by the arrowed line A1. The reference sign CL21 designates the centerline of the robot 1 which has reached the point P2.

Then, the control device 7 controls the traveling device 3 to change the orientation of the robot 1 toward the right side which is a side opposite to the collision side. Specifically, the control device 7 controls the traveling device 3 to rotationally drive the pair of rear wheels 32 in different directions, respectively, and appropriately adjust a steering angle of the pair of front wheels 31, thereby turning the robot 1 in a clockwise direction by an angle θ1 in plan view. The angle θ1 is less than 90 degrees, and the reference sign CL22 designates the center line of the robot 1 whose orientation has been changed at the point P2. A direction in which the robot 1 whose orientation has been changed is oriented at the point P2 is one example of "first direction" as recited in the appended claims.

Then, the control device 7 controls the traveling device 3 to move the robot 1 from the point P2 to a point P3. Specifically, the control device 7 controls the traveling device 3 to move the robot 1 forwardly by a given distance along the center line CL22, as indicated by the arrowed line A2. The point P3 is set to a position on the lateral side of the obstacle 9 with a distance greater than an outside dimension of the robot 1 with respect to the obstacle 9. This allows the robot 1 to reach the point P3 lateral to the obstacle 9 without colliding with the obstacle 9 again. The reference sign CL31 designates the centerline of the robot 1 which has reached the point P3.

Then, the control device 7 controls the traveling device 3 to change the orientation of the robot 1 toward the left side. Specifically, the control device 7 controls the traveling device 3 to stop rotation of one of the rear wheels 32, and rotationally drive the other rear wheel, or to set the rotational speed of one of the rear wheels 32 to become different from the rotational speed of the other rear wheel, or to rotationally drive the pair of rear wheels 32 in different directions, respectively, thereby turning the robot 1 in a counter-clockwise direction by an angle θ2 in plan view. The angle θ2 is greater than θ1, and the reference sign CL32 designates the center line of the robot 1 whose orientation has been changed at the point P3.

Then, the control device 7 controls the traveling device 3 to move the robot 1 from the point P3 to a point P4. Specifically, the control device 7 controls the traveling device 3 to move the robot 1 forwardly by a given distance along the center line CL32, as indicated by the arrowed line A3. The point P4 is located on the forward side with respect to the obstacle 9, and set on an extension line of the center line CL1. The reference sign CL41 designates the centerline of the robot 1 which has reached the point P4.

Then, the control device 7 controls the traveling device 3 to change the orientation of the robot 1 toward the right side. Specifically, the control device 7 controls the traveling device 3 to rotationally drive the pair of rear wheels 32 in different directions, respectively, and appropriately adjust the steering angle of the pair of front wheels 31, thereby turning the robot 1 in the clockwise direction by an angle θ3 in plan view. The reference sign CL42 designates the center line of the robot 1 whose orientation has been changed at the point P4. The center line CL42 is set on the extension line of the center line CL1.

Then, the control device 7 controls the traveling device 3 to move the robot 1 forwardly along the center line CL42 of the robot 1, as indicated by the arrowed line A4. In this way, the robot 1 operates to mow a lawn in a part of the area AR located on the forward side with respect to the obstacle 9.

Functions/Effects

Next, functions/effects based on the robot 1 will be described.

In the event of collision with the obstacle 9, the robot 1 according to the above embodiment is moved forwardly after changing the orientation thereof toward a side opposite to the collision side. That is, when the left side of the robot 1 with respect to the center C thereof collides with the obstacle 9, the orientation of the robot 1 is changed toward the right side. On the other hand, when the right side of the robot 1 with respect to the center C thereof collides with the obstacle 9, the orientation of the robot 1 is changed toward the left side. This makes it possible to set a detour course so as to allow the robot 1 to reliably detour around the obstacle 9 while becoming less likely to enter a part of the area AR where the work has already been completed, thereby suppressing a decrease in work efficiency.

In the robot 1 according to the above embodiment, the control device 7 is operable to control the traveling device 3 to change the orientation of the robot 1 toward the side opposite to the collision side at an angle of less than 90 degrees with respect to the traveling direction of the robot 1 at the time of the collision between the robot 1 and the obstacle 9.

In the robot 1 configured as above, in the event of collision with the obstacle 9, the orientation thereof is changed at an angle θ of less than 90 degrees with respect to the in-collision traveling direction. Thus, after the collision with the obstacle 9, the robot 1 moves from the backward side on which it is located until then to the forward side, so that it becomes less likely to enter a part of the area AR where the work has already been completed. As a result, it becomes possible to quickly complete the work for the entire area AR.

In the robot 1 according to the above embodiment, the control device 7 is operable, when it determines that the robot 1 has collided with the obstacle 9 during the forward movement, to control the traveling device 3 to move the robot 1 backwardly by a given distance, and then change the orientation of the robot 1 toward the side opposite to the collision side at an angle of less than 90 degrees with respect to the traveling direction of the robot 1 at the time of the collision between the robot 1 and the obstacle 9.

In the event of collision with an obstacle 9, the robot 1 configured as above is moved backwardly by a given distance, so that it can be separated from the obstacle 9 which is blocking a traveling course of the robot 1. This makes it possible to detour around the obstacle 9 even when the orientation is changed at a relatively small angle θ1, and thus suppress a situation where a detour course needlessly gets longer.

In the robot 1 according to the above embodiment, the control device 7 is operable, when it determines that the robot 1 has collided with the obstacle 9 during the forward movement, to control the traveling device 3 to: move the robot 1 backwardly by a given distance; then change the orientation of the robot 1 toward the side opposite to the collision side at an angle of less than 90 degrees with respect to the traveling direction of the robot 1 at the time of the collision between the robot 1 and the obstacle 9; then move the robot 1 forwardly in a first direction; and then change the orientation of the robot 1 so as to return to a course extending in the traveling direction of the robot 1 at the time of the collision between the robot 1 and the obstacle 9.

The robot 1 configured as above can return to the course extending in the in collision traveling direction while detouring around the obstacle 9, so that it becomes possible to suppress the situation where the detour course needlessly gets longer.

In the robot 1 according to the above embodiment, the first collision sensor 5 (second collision sensor 6) comprises the first magnet 52 (second magnet 62), and the first hall sensor 51 (second hall sensor 61) having the detection part 51*a* (61*a*) to detect the intensity of a magnetic field generated by the first magnet 52 (second magnet 62), the first hall sensor 51 (second hall sensor 61) being configured to output a signal corresponding to the intensity of the magnetic field, wherein, in a direction parallel to the straight line M1 (M2) passing through the N pole and the S pole of the first magnet 52 (second magnet 62), the detection part 51*a* (61*a*) of the first hall sensor 51 (second hall sensor 61) is disposed at a position between the N pole-side end 52*n* (62*n*) and the S pole-side end 52*s* (62*s*) of the first magnet 52 (second magnet 62), and wherein the position of the detection part 51*a* (61*a*) of the first hall sensor 51 (second hall sensor 61) with respect to the first magnet 52 (second magnet 62) is changeable in the direction parallel to the straight line, based on the collision between the robot 1 and the obstacle 9.

When the robot 1 configured as above collides with an obstacle 9, the position of the detection part 51*a* (61*a*) of the first hall sensor 51 (second hall sensor 61) with respect to the first magnet 52 (second magnet 62) is changed. Since the detection part 51*a* (61*a*) is disposed at a position opposed to the middle 52*c* (62*c*) between the N pole-side end 52*n* (62*n*) and the S pole-side end 52*s* (62*s*), the intensity of the magnetic field detected by the detection part 51*a* (61*a*) shows opposite changes (decreasing and rising), respectively, when the detection part 51*a* (61*a*) is relatively displaced from the position toward the N pole side and when the detection part is relatively displaced from the position toward the S pole side. Thus, the control device 7 can determine that the robot 1 has collided with an obstacle, based on such a change in the signal.

The robot 1 according to the above embodiment comprises two collision sensor (first collision sensor 5 and second collision sensor 6), wherein the first magnet 52 of the first collision sensor 5 is disposed such that the straight line M1 passing through the N pole end and the S pole thereof passes through the center C of the robot 1 and becomes approximately parallel to the center line CL extending along the forward/backward direction of the robot 1, and the second magnet 62 of the second collision sensor 6 is disposed such that the straight line M2 passing through the N pole end and the S pole thereof becomes approximately orthogonal to the center line CL.

When the robot 1 configured as above collides with the obstacle 9 in the forward/backward direction, the signal output by the first collision sensor 5 changes, and when it collides with the obstacle 9 in the rightward/leftward direction, the signal output by the second collision sensor 6 changes. Thus, based on such signals, the control device 7 can determine whether or not the robot 1 has collided with the obstacle 9 in the forward/backward direction and in the rightward/leftward direction.

In the robot 1 according to the above embodiment, the second magnet 62 and the second hall sensor 61 of the second collision sensor 6 are disposed on the center line CL.

Even in a situation where a distortion arises in the structure of the robot 1 in a roll direction (i.e., direction about the central line CL), the amount of the distortion is smaller in a part of the robot 1 on the central line CL than in a remaining part of the robot 1. By disposing the second collision sensor 6 on the center line CL, the robot 1 can suppress a bad influence of the distortion of the structure of the robot 1 on the second collision sensor 6, thereby improving accuracy in determination of collision between the robot 1 and the obstacle 8.

The robot 1 according to the above embodiment comprises the robot main unit 2 provided with the traveling device 3 and the control device 7, and the cover 8 which covers the robot main unit 2, wherein the first magnet 52 and the second magnet 62 are provided in the cover 8, and the first hall sensor 51 and the second hole sensor 61 are provided in the robot main unit 2.

In the robot 1 configured as above, there is no need to provide a feed line and a signal line extending from the robot main unit 2 provided with the first hall sensor 51 and the second hole sensor 61, to the first magnet 52 and the second magnet 62 provided in the cover 8. This makes it possible to simplify a structure around the first hall sensor 51 and the second hole sensor 61, and improve reliability thereof.

<Second Mode of Detour Course>

Figure 5:
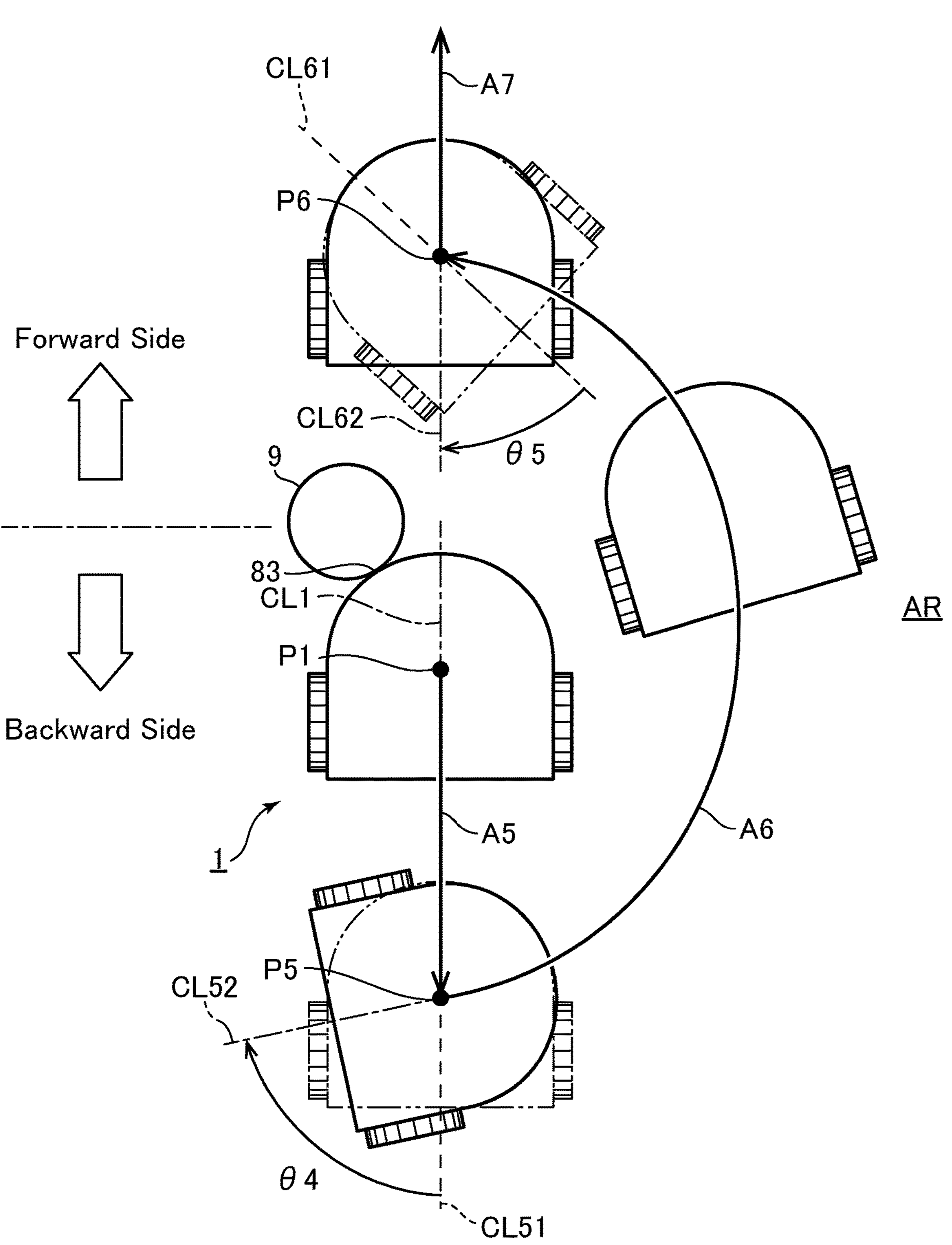
FIG. 5 is an explanatory diagram showing a second mode of the detour course of the work robot in plan view.

Next, with reference to FIG. 5, another mode of the detour course of the robot 1 which has collided with the obstacle 9 will be described. FIG. 5 is an explanatory diagram showing a second mode of the detour course of the robot in plan view, in a situation where when the robot being moved forwardly while mowing a lawn in an area AR reaches a point P1, the front left part 83 of the robot 1 collides with the obstacle 9.

The second mode of the detour course is different from the aforementioned first mode in terms of a course along which the robot 1 is moved from the backward side to the forward side. Description of any element or component substantially the same as that in the first mode, among elements or components in the second mode, will be appropriately omitted.

When the control device 7 determines that the front side and the left side of the robot 1 with respect to the center C has collided with an obstacle, the control device 7 controls the traveling device 3 to move the robot 1 from the point P1 to a point P5. Specifically, the control device 7 controls the traveling device 3 to move the robot 1 backwardly by a given distance along a center line CL1 of the robot 1 at the time of collision with the obstacle 9, as indicated by the arrowed line A5. The reference sign CL51 designates the centerline of the robot 1 which has reached the point P5.

Then, the control device 7 controls the traveling device 3 to change the orientation of the robot 1 toward the right side which is a side opposite to the collision side. Specifically, the control device 7 controls the traveling device 3 to turn the robot 1 in a clockwise direction by an angle θ4 in plan view. The angle θ4 is less than 90 degrees, and the reference sign CL52 designates the center line of the robot 1 whose orientation has been changed at the point P5. A direction in which the robot 1 whose orientation has been changed is oriented at the point P5 is one example of "first direction" as recited in the appended claims.

Then, the control device 7 controls the traveling device 3 to move the robot 1 from the point P5 to a point P6. Specifically, the control device 7 controls the traveling device 3 to move the robot 1 forwardly along an approximately arc-shaped course, as indicated by the arrowed line A6. This course is set at positions with a distance greater than the outside dimension of the robot 1 with respect to the obstacle 9. Further, the point P6 is located on the forward side with respect to the obstacle 9, and set on an extension line of the center line CL1. The reference sign CL61 designates the centerline of the robot 1 which has reached the point P6.

Then, the control device 7 controls the traveling device 3 to turn the robot 1 in the clockwise direction by an angle θ5 in plan view. The reference sign CL62 designates the center line of the robot 1 whose orientation has been changed at the point P6. The center line CL62 is set on the extension line of the center line CL1 of the robot 1 at the time of the collision with the obstacle 9.

Then, the control device 7 controls the traveling device 3 to move the robot 1 forwardly along the center line CL62 of the robot 1, as indicated by the arrowed line A7. In this way, the robot 1 operates to mow a lawn in a part of the area AR located on the forward side with respect to the obstacle 9.

The above embodiment is intended to facilitate understanding the present invention, but not meant to be construed as limiting the scope of the present invention. It should be understood that each element or component provided in the above embodiment and arrangement, material, conditions, size thereof are not limited to those disclosed therein, but various changes and modifications may be made therein.

LIST OF REFERENCE SIGNS

1: work robot
2: robot main unit
3: traveling device
5: first collision sensor
51: first hall sensor
51*a*: detection part
52: first magnet
52*n*: N pole-side end
52*s*: S pole-side end
52*c*: middle
6: second collision sensor
61: second hall sensor
61*a*: detection part
62: second magnet
62*n*: N pole-side end
62*s*: S pole-side end
62*c*: middle
7: control device
8: cover
9: obstacle
AR: area

What is claimed is:

1. A work robot designed to perform a given work while traveling autonomously over a given area, the work robot comprising:

a traveling device configured to switch between forward and backward movements of the work robot, and change an orientation of the work robot;

collision sensors configured to output a signal regarding a collision between the work robot and an obstacle; and a control device configured to determine, based on the signal received from the collision sensors, whether or not the work robot has collided with an obstacle, and further determine a collision side indicative of whether the work robot has collided with the obstacle on a left side with respect to a center of the work robot, or has collided with the obstacle on a right side with respect to the center of the work robot, so as to control the traveling device, wherein the collision sensors comprise a magnet, and a hall sensor having a detection part to detect an intensity of a magnetic field generated by the magnet, the hall sensor being configured to output a signal corresponding to the intensity of the magnetic field, in a direction parallel to a straight line passing through an N pole and an S pole of the magnet, the detection part of the hall sensor is disposed at a position between an N pole-side end and an S pole-side end of the magnet, the position of the detection part of the hall sensor with respect to the magnet is changeable in the direction parallel to the straight line, based on the collision between the work robot and the obstacle, the collision sensors have a first collision sensor and a second collision sensor, the magnet of the first collision sensor is disposed such that the straight line passing through the N pole end and the S pole thereof passes through the center of the work robot and becomes approximately parallel to a center line extending along a forward/backward direction of the work robot, the magnet of the second collision sensor is disposed such that the straight line passing through the N pole end and the S pole thereof becomes approximately orthogonal to the center line, and based on the signals received from the first and second collision sensors during the forward movement and during the backward movement, the control device is configured and/or operable to determine that the work robot has collided with the obstacle with an external force applied to the work robot in a direction inclined to the center line that indicates a collision on the left side or a collision on the right side with respect to the center of the work robot, and the control device is configured and/or operable to control the traveling device to change the orientation of the work robot toward a side opposite to the collision side, and then move the work robot forwardly.

2. The work robot according to claim 1, wherein the control device is operable to control the traveling device to change the orientation of the work robot toward the side opposite to the collision side at an angle of less than 90 degrees with respect to a traveling direction of the work robot at a time of the collision between the work robot and the obstacle.

3. The work robot according to claim 2, wherein the control device is operable, when it determines that the work robot has collided with the obstacle during the forward movement, to control the traveling device to move the work robot backwardly by a given distance, and then change the orientation of the work robot toward the side opposite to the collision side at an angle of less than 90 degrees with respect to the traveling direction of the work robot at the time of the collision between the work robot and the obstacle.

4. The work robot according to claim 3, wherein the control device is operable, when it determines that the work robot has collided with the obstacle during the forward movement, to control the traveling device to: move the work robot backwardly by a given distance; then change the orientation of the work robot toward the side opposite to the collision side at an angle of less than 90 degrees with respect to the traveling direction of the work robot at the time of the collision between the work robot and the obstacle; then move the work robot forwardly in a first direction; and then change the orientation of the work robot so as to return to a course extending in the traveling direction of the work robot at the time of the collision between the work robot and the obstacle.

5. The work robot according to claim 1, wherein the magnet and the hall sensor of the second collision sensor are disposed on the center line.

6. The work robot according to claim 1, which comprises a robot main unit provided with the traveling device and the control device, and a cover which covers the robot main unit, wherein the magnet is provided in the cover, and the hall sensor is provided in the robot main unit.

* * * * *